(12) United States Patent
Kawasaki et al.

(10) Patent No.: US 6,919,635 B2
(45) Date of Patent: Jul. 19, 2005

(54) HIGH DENSITY MICROVIA SUBSTRATE WITH HIGH WIREABILITY

(75) Inventors: Kazushige Kawasaki, Shiga-ken (JP); Irving Memis, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 10/701,311

(22) Filed: Nov. 4, 2003

(65) Prior Publication Data

US 2005/0093133 A1 May 5, 2005

(51) Int. Cl.$^7$ ............................................. H01L 23/48
(52) U.S. Cl. ..................... 257/750; 257/778; 257/774; 257/691; 257/775; 257/776; 257/207; 257/208; 438/27; 438/108
(58) Field of Search ................................. 257/778, 691, 257/774, 775, 776, 207, 208; 438/27, 108

(56) References Cited

U.S. PATENT DOCUMENTS

| | | | |
|---|---|---|---|
| 3,963,920 A | * 6/1976 | Palmer | 250/239 |
| 4,232,219 A | * 11/1980 | Yamamoto et al. | 250/227.11 |
| 4,426,548 A | * 1/1984 | Oritsuki et al. | 174/72 R |
| 5,397,917 A | * 3/1995 | Ommen et al. | 257/698 |
| 5,569,960 A | * 10/1996 | Kumazawa et al. | 257/738 |
| 5,761,044 A | * 6/1998 | Nakajima | 361/719 |
| 5,969,426 A | * 10/1999 | Baba et al. | 257/778 |
| 6,384,341 B1 | 5/2002 | Rothermel et al. | 174/255 |
| 6,538,213 B1 | 3/2003 | Carden et al. | 174/262 |
| 6,577,003 B1 | 6/2003 | Crane, Jr. et al. | 257/738 |
| 2002/0060318 A1 | 5/2002 | Katz | 257/24 |
| 2003/0019838 A1 | * 1/2003 | Shaw et al. | 216/20 |
| 2004/0257503 A1 | * 12/2004 | Yamazaki | 349/113 |

FOREIGN PATENT DOCUMENTS

| | | | | |
|---|---|---|---|---|
| JP | 7-11557 | * | 4/1995 | H04N/1/04 |

OTHER PUBLICATIONS

2003 IEEE/CPMT/SEMI Int'l Electronics Manufacturing Technology Symposium by T. Nishio, et al., entitled "An Approach to Reduce Build Up Layers for Flip Chip—Ball Grid Array(FC–BGA) Substrates".

* cited by examiner

Primary Examiner—Jasmine Clark
(74) Attorney, Agent, or Firm—John A. Jordan; William H. Steinberg

(57) ABSTRACT

The density of plated thru holes in a glass fiber based chip carrier is increased by off-setting holes to positions in which fibers from adjacent holes will not connect. Elongated strip zones or regions having a width approximately the diameter of the holes and running along orthogonal columns and rows of holes, parallel to the direction of fibers, define regions of fibers that can possibly cause shorting between holes. Rotating a conventional X-Y grid pattern of equidistant holes so as to position, for example, alternate holes in one direction between the elongated strip zones running in the opposite direction significantly increases the distance between holes along the elongated strip zones running in each direction. The holes are positioned between elongated strip zones with sufficient clearance to compensate for variations in the linear path of fibers.

30 Claims, 4 Drawing Sheets

HIGH DENSITY MICROVIA SUBSTRATE WITH HIGH WIREABILITY

BACKGROUND OF THE INVENTION

1. Field of the Invention

The present invention relates to chip carriers and, more particularly, to high density chip carriers with high wireability for use with flip chip technology, and the like.

2. Background and Related Art

As the terminal density of semiconductor chips and, particularly, the density of Input/Output (I/O) connections of chips increases with improved technology, the wireability of chip carriers becomes more problematic. The density of terminals tightly clustered makes it difficult to construct mutually segregated conductors to connect carrier lines to each terminal. Signal carrying terminals and lines are particularly burdensome since they must be segregated from each other as well as from power and ground lines. Signal lines on the chip carrier must have sufficient electrical isolation from other conductors so that undesired coupling and leakage paths are avoided.

To enable routing in highly dense chip carriers, microvia, as well as other technologies, have been developed. Microvia chip carriers typically use multiple layers to make the required interconnections, particularly in chip packages using flip-chip ball grid array (BGA) technology. In these high pin count technologies, the density of wiring and the wireability of the layers is important, particularly in terms of cost, yield, performance and reliability. "Wireability", in this regard, can be viewed as the technical possibility of positioning routing lines so that all signals may "escape" (inward or outward) from a given pattern or layer. Constraint considerations for routing include via density, routing line widths and clearances, the terminal sizes and required clearances, the shielding requirements and other design constraints known in the art.

Microvia chip carrier substrates are generally built around a core with plated thru holes (PTHs). Such high density interconnect (HDI) chip carriers use build-up of layers on each side of a core made of epoxy-glass layers. The glass layers are made of a glass cloth impregnated with epoxy and are laminated at elevated temperatures to make a solid, dimentially stable core. The build up layers on each side of the core are generally non-reinforced epoxy. U.S. Pat. No. 6,518,516B2 describes a typical microvia chip carrier.

The density constraints of the PTH's in the core limits the vertical interconnection capability between the front and back of the carrier. For example, high density PTH arrangements can result in reliability failures along glass fibers, from one hole to another, when the holes are placed too close together. The inability to interconnect a large number of signals from the front and back of a chip carrier because of PTH density constraints caused by reliability problems when PTHs are placed too close together, limits the ability to connect higher I/O count chips to a chip carrier or to interconnect such chips to a printed circuit board (PCB).

Shorting between PTHs in glass reinforced epoxy carriers has been attributed to the fact that the epoxy bond to glass fibers is fairly poor. When PTHs are drilled in the core and plating chemicals are used to plate the PTHs, the poor bonding of epoxy to the glass fibers allows the plating chemicals to penetrate some distance along the fibers. This penetration can result in electrical shorting between holes.

SUMMARY OF THE PRESENT INVENTION

In accordance with the present invention, increased PTH density is achieved in fiber based chip carriers without the risk of fiber induced shorting by off-setting PTHs in a hole jog pattern. Fiber based chip carrier substrates typically arrange the fibers in a matrix pattern where the fibers are woven orthogonal to one another in an X-Y direction. By offsetting alternate rows of PTHs, the distance between holes along the same strands of fibers is substantially increased. Such an arrangement allows for increasing PTH density without decreasing the PTH to PTH spacing along the same strands of fibers. Jog patterns can be obtained by rotating a conventional X-Y grid pattern of PTHs between approximately 15° and 60°, depending upon such factors as the spacing between PTHs, the diameter of PTHs and the desired separation between rows and columns of PTHs.

In one arrangement, X-rows of PTHs are rotated by about 30° to move alternate Y-row vias between Y-rows, thereby more than doubling straight pitch (in-line pitch) in both the X and Y direction, depending upon the drill bit size used for the PTH. Such rotation provides a good comprise between competing parameters, such as drill bit size diameter and the spacing between holes, both in a straight line and in lateral separation.

Accordingly, it is an object of the present invention to provide an improved chip carrier.

It is a further object of the present invention to provide a chip carrier with improved wireability.

It is yet a further object of the present invention to provide a chip carrier with increased PTH density.

It is yet still a further object of the present invention to provide an improved method and layout arrangement for positioning PTHs in a multilayer chip carrier using fiber based technology.

It is another object of the present invention to provide a high density PTH layout method and arrangement for use in epoxy impregnated glass fiber multilayered chip carriers.

It is still another object of the present invention to provide high density PTH fiber-based chip carriers without decreasing PTH to PTH space in the X-Y direction.

DETAILED DESCRIPTION

Figure 1:
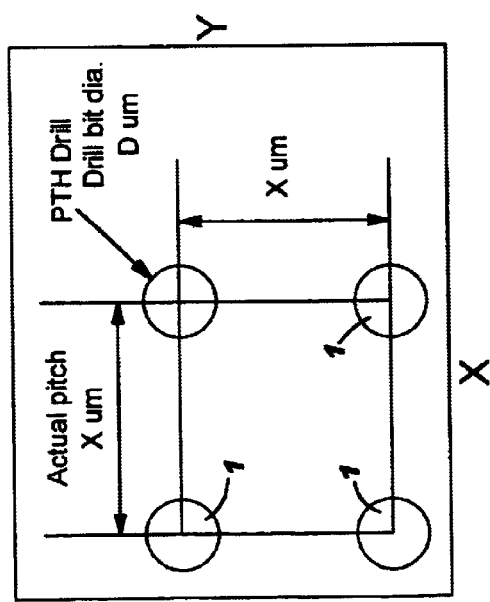
FIG. 1 shows a top view of a typical microvia X-Y matrix or grid arrangement of holes used to form PTHs in chip carriers.

With reference to FIG. 1, there is shown a pattern of circles or holes 1 each representing a typical PTH with drill bit diameter D$\mu$m. Typically, the PTHs are plated to form a PTH grid arrangement. As shown, the holes 1 are arranged in an X-Y grid arrangement. In such arrangement, the X and Y lines of PTHs 1 are aligned with the direction of the glass fibers in the layers of the multilayer chip carrier. The fibers in the layers of such structure are typically woven in a mesh-like pattern with the fibers running parallel to one another and in both the X and Y direction generally intersecting orthogonally or at approximately at 90° The actual pitch X μm of holes is shown for both the X and Y directions. As used herein "orthogonal" means 90° or some minor variation one way or another.

The PTHs 1 in FIG. 1 would typically have a diameter of 150 μm and would be 300 μm or higher apart in both the X and Y direction. This results in a 450 μm or higher pitch which gives a density of about 5 holes per square mm. This limits the density of HDI chip carrier substrates since most of the wiring is on the top side of the substrate (close to the chip) and only a limited number of signals can be routed to the bottom side of the carrier in the region under the chip. It is clear that this becomes more of a problem as chip signal density increases. A typical high signal count density under a chip is 2000 signals in a 10 mm chip or 20 signals per square mm. Since, typically, a maximum of 5 holes per square mm can be routed to the bottom half of the chip carrier through the core, approximately 75% of the wiring, then, must be contained on the top side. This increases the number of layers needed for HDI chip carriers which increases cost and also lengthens the path between the chip and bottom of the chip carrier, thereby affecting performance. In accordance with the present invention, a solution to the above problem is provided in the form of a hole layout pattern that allows the holes to be placed closer to each other while at the same time avoiding shorting between holes.

Figure 2:
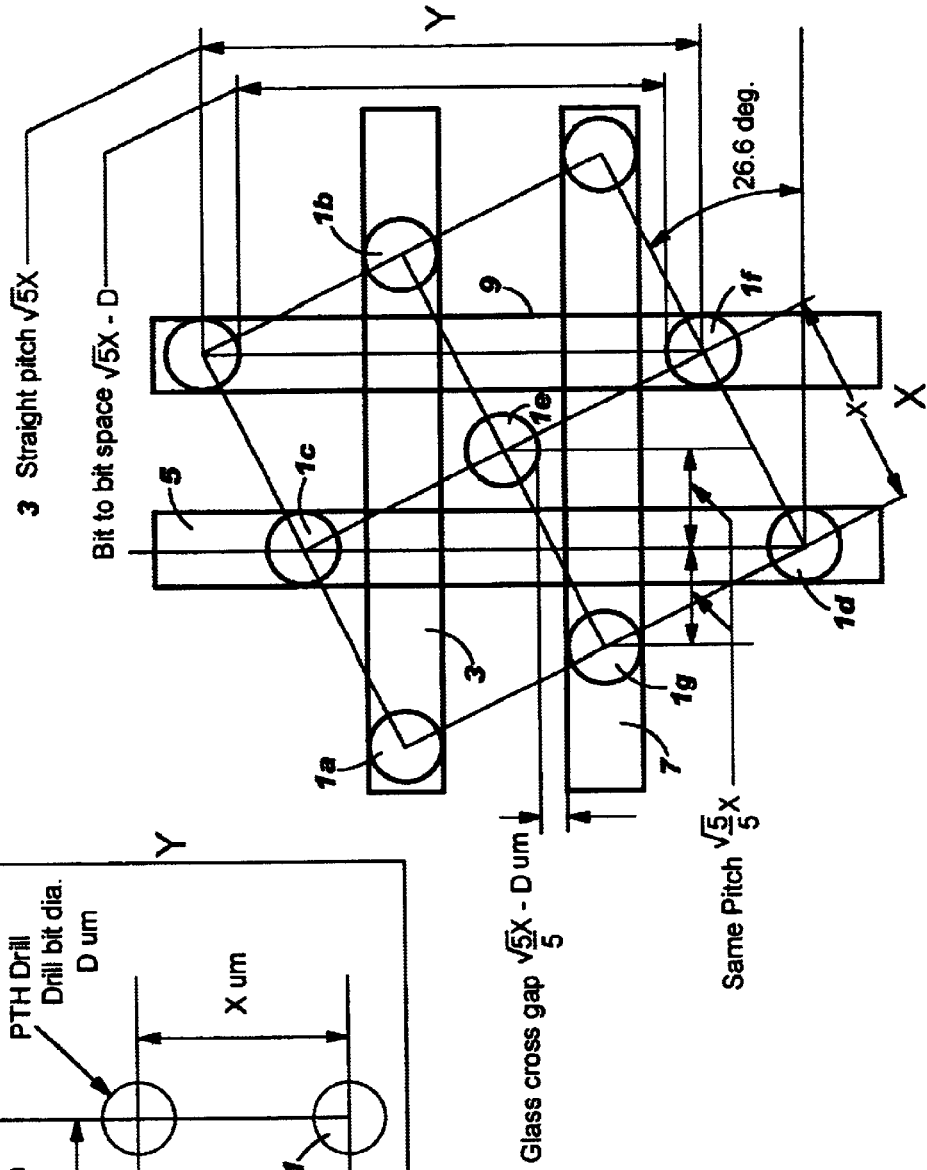
FIG. 2 shows a top view of an arrangement of holes, in accordance with the present invention, formed by rotating the matrix or grid arrangement of FIG. 1 with respect to the X-Y plane to offset the holes.

FIG. 2 shows a top view one arrangement of a PTH off-set layout pattern for a chip carrier, in accordance with the present invention. The layout uses nine PTHs to aid in describing the off-set pattern, but it is clear that such pattern would be repeated many times over with the same spacing being repeated along the same lines in both the X and Y directions. The same actual pitch X μm as shown in FIG. 1 is used. The glass fibers in FIG. 2 run in the X and Y directions, as in FIG. 1, and thus along X and Y elongated strip zones or regions 3, 5, 7 and 9. These strip zones or regions define the regions in the chip carrier where glass fibers could interconnect holes. In this regard, the diameter of the fibers may be many times smaller than the width of the zone.

Although the arrangement of FIG. 2 shows a rotation of 26.6° about the middle hole 1f of the bottom row of holes to form the off-set pattern, it is clear that variations in the extent of this rotation may be made in accordance with the particular design choice and/or ground rules being employed. Rotations of 26.6° provides the same in-line spacing between holes in the X and Y directions. "In-line spacing" is the spacing between holes along the same X and Y lines, shown as bit-to-bit spacing in FIG. 2. Thus, the spacing between holes 1a and 1b along elongated strip zones or region 3 is the same as the spacing between holes 1c and 1d along elongated strip zone or region 5. Similarly, the same spacing exists between holes along elongated strip zones or regions 7 and 9. Although the strip zones or regions 3, 5, 7 and 9 represent zones or regions within which glass fibers in the X and Y directions could provide a shorting path between holes, fiber paths may have some slight linear variation requiring some separation between these strips and adjacent holes.

It is clear that any rotation that is about 30° will give substantially the same spacing between holes in the X and Y directions. It can be seen that the purpose of rotating the pattern of holes it to rotate aligned adjacent holes in the X and Y direction to an off-line or off-set position to thereby increase the distance between in-line holes. Thus, holes 1c, 1e and 1f which would otherwise be aligned along strip region 9, are off-set from one another thereby substantially increasing the distance between new in-line holes 1c and 1d. Thus, the bit-to-bit spacing along a line of holes, as shown in FIG. 2, is increased from X minus D to the square root of 5 times X minus D, where X is the actual pitch shown in FIG. 1 and D is the PTH drill bit diameter. Similarly, the straight pitch (or straight line pitch) is increased from X to the square root of 5 times X.

As further shown in FIG. 2, the glass cross gap distance for this arrangement is the square root of 5 over 5 times X minus D. The glass cross gap represents the distance between elongated strip zones and, as hereinabove indicated, the strip zones define linear regions within which fibers could potentially interconnect holes. The glass cross gap distance provides a margin of safety against some linear irregularity in fiber paths that might otherwise provide opportunity for shorting between holes.

In the arrangement of FIG. 2, the angle of rotation used provides an effective compromise among the possible angles of rotation. Although different applications may allow rotations of between 150 to 60°, the angle shown not only provides the same distance between holes in the X and Y direction, but it also provides the same glass cross gap distance in the X and Y directions. In addition, "same pitch", defined by the square root of 5 over 5 times X, exists uniformly between adjacent lines of holes, as rotated, in both the X and Y direction. Thus, the same pitch exists between holes 1c and 1g as exists between holes 1c and 1e in the X direction. The same pitch is present along adjacent holes in the Y direction. The following table shows some typical examples of how the variables shown in FIG. 2 interrelate. All values are in μm and are rounded.

| Actual Pitch | Drill Bit | Straight Pitch | Bit to Bit Pitch | Glass Cross Cap |
|---|---|---|---|---|
| X | D | P | SP | GG |
| 212 | 50 | 470 | 424 | 45 |
| 212 | 90 | 470 | 384 | 5 |
| 225 | 50 | 503 | 453 | 51 |
| 225 | 100 | 503 | 404 | 0 |
| 250 | 50 | 559 | 509 | 62 |
| 250 | 100 | 559 | 459 | 12 |
| 300 | 50 | 670 | 620 | 84 |
| 300 | 100 | 670 | 570 | 34 |

The above table shows how the glass cross gap distance, in particular, varies with several examples of actual pitch value X, in μm, for drill bit sizes generally between 50 and 100 μm. As can be seen, the glass cross gap distance for a drill bit diameter of 100 μm and actual pitch value of 212 μm would go negative, meaning there would be overlap between adjacent strips or zones of fibers similarly, other pitch values have points at which a drill bit size will cause the glass cross gap distance to go negative. Accordingly, the cross gap distance can be adjusted to meet the conditions of the particular application employed.

It should be understood that FIG. 2 and above table set forth a specific example of how the spacing between holes along a line or region of fibers may be increased. It is clear that by rotating the grid arrangement off axis, from the direction of strands of fiber, the spacing is increased by both the diagonal dimension and the potential for skipping holes along the same zone of fiber strands. Since the zones of fiber strands are defined by the diameter of the holes, smaller diameter holes increase the potential of skipping holes alone these zones of fiber strands. The glass or fiber cross gap separation, however, must also be maintained to some degree, although configurations may be possible which would allow very minimal or negative cross gap for holes that are sufficiently distant from one another in the direction of fibers. It should also be understood that placement of holes in the direction of fibers does not necessarily require that the holes be exactly aligned as long as appropriate cross gap separation is maintained.

Figure 3:
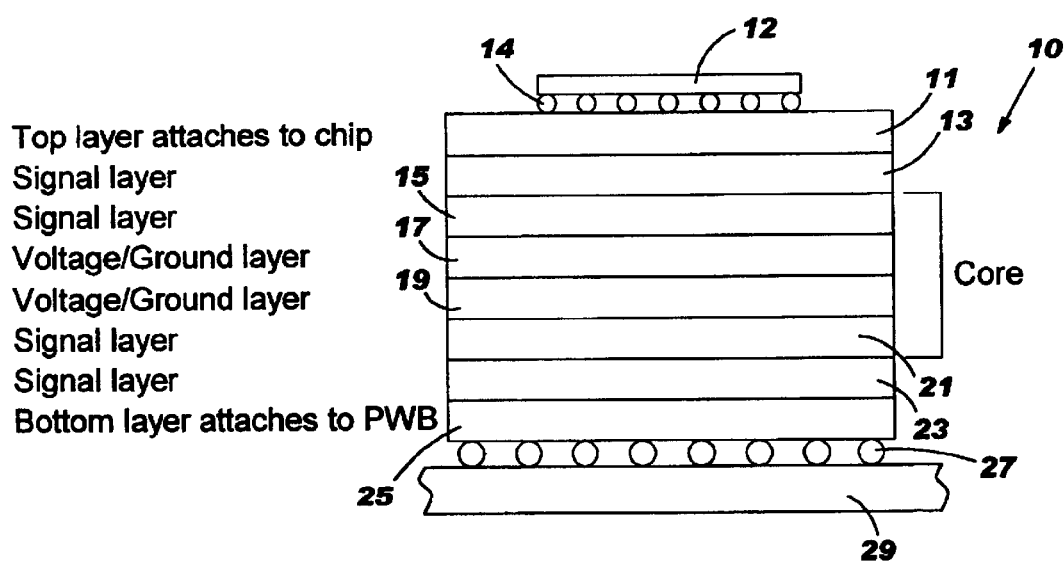
FIG. 3 depicts the cross-section layers of a typical eight layer chip carrier.

FIG. 3 shows a cross-sectional view of a typical 8 layer chip carrier 10 used, for example, for carrying flip chips, such as, C4 chips, in a BGA chip carrier arrangement. Layer 11 attaches to chip 12 through solder ball connections 14 in a manner well known to those skilled in the art. It is clear that although one chip is shown for purposes of illustration, that more than one chip may be attached to chip carrier 10. It is also clear that layer 11 could also attach to other electrical components. As is also well known to those skilled in the art, the chip(s) act to provide a signal processing arrangement. Layer 13 acts as the build up layer on the chip side of the core. Signal layers 15 and 21, along with Voltage/Ground Layers 17 and 19, comprise the core. Layer 25 is the BGA layer which attaches, through solder bumps 27, to printed wiring board (PWB) 29 to transmit signals thereto from signal layer 23. The PWB 29 may be any circuitized substrate. Signal layers 13 and 15 provide fan out of signals from the chip. In chip carrier arrangements like FIG. 3, the number of signal layers required may be determined by the net count between the chip to BGA connections and the chip solder balls to BGA bump pitches. It is understood that the various layers include dielectric material separating conductive layers.

Thus, as 10 mm chips move toward providing up to 2000 signals, limitations on increased microvia density in the core due to fiber shorting would be necessarily required more signal layers. However, in accordance with the PTH layout pattern of the present invention, increased density of PTHs in the core layers 15, 17, 19 and 21 allows more signals to be vertically transmitted beneath the chip thereby limiting the number of total layers required. Thus, the hole layout pattern may begin on either signal layer 13 or 15, and the holes made to extend through the core and end in either layer 21 or 23.

Figure 4:
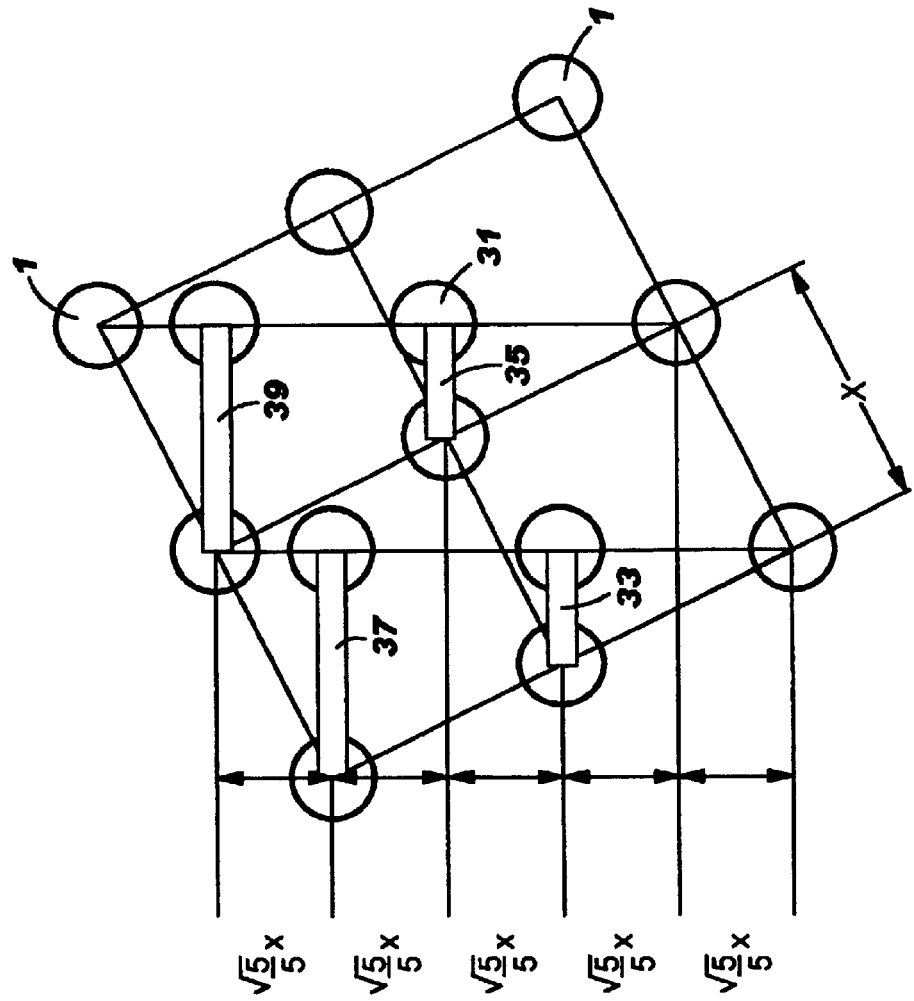
FIG. 4 shows one arrangement in which the holes of a rotated signal layer may be connected to a non-rotated array of holes.
Figure 5:
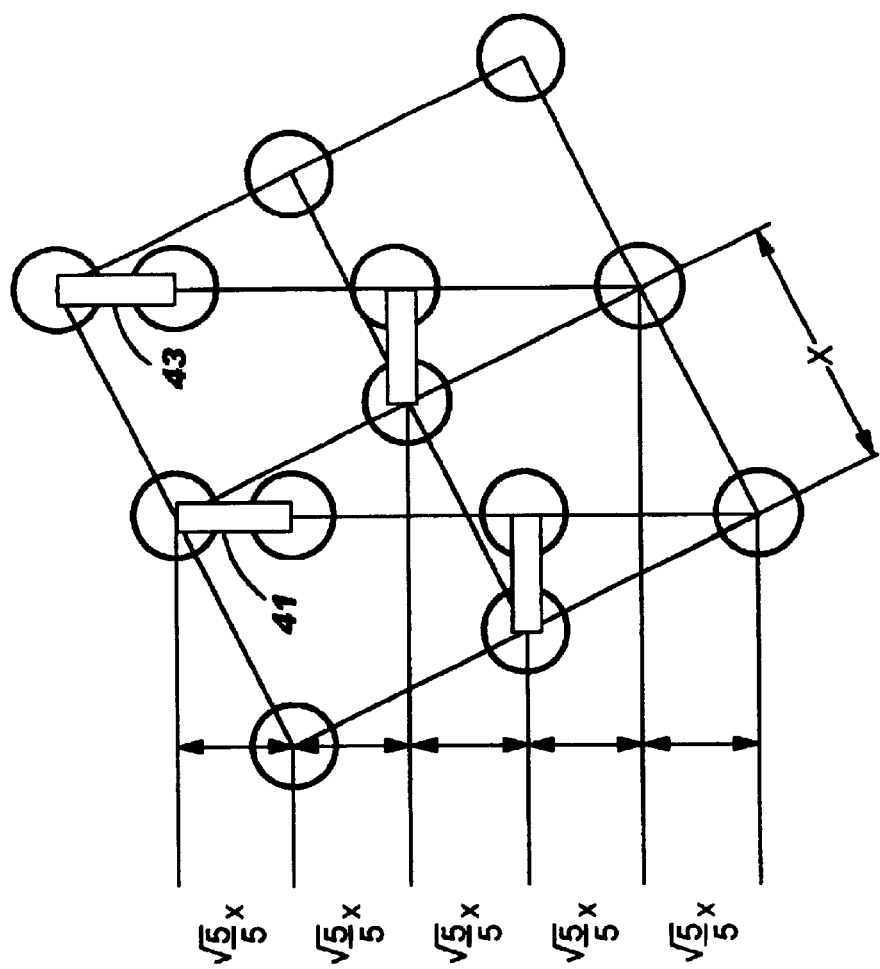
FIG. 5 shows another arrangement in which the holes of a rotated signal layer may be connected to a non-rotated array of holes.

FIG. 4 shows one arrangement for connecting holes that have been rotated to holes that have not been rotated. This may be used, for example, where a pattern of rotated electrical contacts of a hole is required to interface with the non-rotated contacts. Thus, for example, the rotated hole contacts through layer 13 and the core could be connected to non-rotated contacts on layer 23. Connections through metal lines 33, 35, 37 and 39 are made in the X-direction. FIG. 5 shows a similar arrangement with somewhat different metal line connections 41 and 43.

Although reference has been made to PTHs in fiber based materials, such as glass fibers and woven glass fibers impregnated with epoxy, it is clear that the pattern layout of PTH electrical connectors through the chip carrier, in accordance with the present invention, may be employed with other technical approaches to connecting chips or other electrical components to substrates. Thus, for example, where conductive pins or other electrical contacts may be employed in a substrate, such as, a chip carrier reinforced with some form of strand or fiber having potential for shorting, the off-set pattern of the present invention may be employed to increase in-line spacing along the fiber between such pins or contacts to allow increased density. In this regard, the term "connection point", as used herein, may comprise any of a variety of connection point technologies used to enable routing in highly dense integrated circuit packages, such as, microvia, blind via, burried via, staggered via, bond pad, and other similar technologies.

Similarly, the substrate need not be a chip carrier per se but could be any fiber-based substrate material for carrying electronic components having conductors formed thereon or extending therein that have potential for shorting. Such substrate may be a single layer or multilayer substrate. Where conductive vias are employed in a multilayer substrate, the vias may extend through any one or all of the layers.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A substrate, comprising:
   at least one layer of fiber based material having an array of fibers extending in a direction generally parallel to one another;
   an array of electrical connection points extending along said at least one layer of fiber based material arranged in parallel lines of connection points extending generally parallel to the direction of said fibers with the distance between successive connection points in each of said parallel lines of connection points being greater than the distance between the lines of connection points in adjacent ones of said parallel lines of connection points.

2. The substrate as set forth in claim 1 wherein said array of fibers extend in two directions generally orthogonal to one another.

3. The substrate as set forth in claim 2 wherein said parallel lines of connection points extending generally parallel to said array of fibers extend in two directions generally orthogonal to one another and generally parallel with said array of fibers extending in two directions generally orthogonal to one another with the connection points in each direction positioned between the lines of connection points in said generally orthogonal direction.

4. The substrate as set forth in claim 3 wherein said array of fibers comprises multiple layers of glass cloth impregnated with epoxy laminated together.

5. The substrate as set forth in claim 3 wherein said substrate is a chip carrier with at least one chip attached thereto.

6. The substrate as set forth in claim 3 wherein said connection points are holes for conducting material.

7. The substrate as set forth in claim 6 wherein said lines in said line of holes are elongated strip regions on said layer of fiber based material with said regions having a width the same as the diameter of said holes that defines zones where fibers interconnect said holes.

8. The substrate as set forth in claim 7 comprising a chip carrier substrate having one surface attached to at least one chip and another surface attached to a circuitized substrate and wherein said holes are plated thru holes used for connecting said at least one chip to said circuitized substrate.

9. The substrate as set forth in claim 7 wherein the distance between successive holes along said elongated strip region is the square root of 5 times the distance between diagonal lines of holes less the diameter of said holes.

10. An integrated circuit carrier structure, comprising:
    at least one layer of a fiber based material having an array of fibers extending in at least one direction generally parallel to one another;
    an array of electrical connection points extending along said at least one layer of fiber based material with said array of connection points comprising parallel lines of equally spaced connection points extending in two directions generally orthogonal to one another and positioned so that the lines of said equally spaced connection points are at an angle with respect to the said direction of said fibers.

11. The integrated circuit carrier structure as set forth in claim 10 wherein said connection points have a given diameter and lines of connection points along the same direction of said fibers have elongated strip zones with a width the diameter of said connection points that define a region of fibers along said strip zones that interconnect said connection points and wherein said angle is such as to position alternate connection points extending in one direction of said array between the elongated strip zones extending in the opposite direction.

12. The integrated circuit carrier structure as set forth in claim 11 wherein said connection points are holes for conductive material.

13. The integrated circuit carrier structure as set forth in claim 12 wherein said angle is approximately 30 degrees.

14. The integrated circuit carrier structure as set forth in claim 12 wherein said angle is such as to position said alternate connection points extending in one direction of said array equal distance between said strip zones extending in the opposite direction.

15. The integrated circuit carrier structure as set forth in claim 12 including at least one chip having electrical contacts respectively electrically connected to individual ones of said array of connection points and a circuitized substrate having electrical contacts respectively electrically connected to individual ones of said array of connection points to thereby form a signal processing arrangement.

16. The integrated circuit carrier structure as set forth in claim 12 wherein said at least one layer of fiber based material comprises multiple layers of impregnated woven glass fiber material.

17. An integrated circuit carrier structure, comprising:
at least one layer of a fiber material formed in a binding medium and having parallel fibers extending in generally orthogonal directions;
an array of connection points of a given diameter formed on said at least one layer in parallel columns and rows generally orthogonal to one another and extending parallel to the direction of said fibers with said column and rows of connecting points formed along columns and rows of elongated strip zones with said zones having a width of approximately said given diameter and defining a region of fibers interconnecting said connection points, said array of connection points arranged such that connection points in alternate columns are positioned between said rows of elongated strip zones and connection points in alternate rows are positioned between said columns of elongated strip zone.

18. The integrated circuit carrier structure as set forth in claim 17 wherein said connection points are holes for conductive material.

19. The integrated circuit carrier structure as set forth in claim 18 wherein said holes in said alternate columns and rows are positioned at the approximately midpoint of said elongated strip zones.

20. The integrated circuit carrier structure as set forth in claim 19 including at least one chip having electrical contacts respectively attached to said array of connection points on said at least one layer.

21. The integrated circuit carrier structure as set forth in claim 20 including a circuitized substrate attached to the opposing surface of the said connection points on said at least one layer.

22. A method of positioning electrical connection points having a given diameter along a substrate, comprising:
providing a substrate layer having parallel fibers extending in generally orthogonal directions to one another; and
positioning said electrical connection points having a given diameter in columns and rows parallel to the direction of said fibers so that the distance between successive connection points in said rows and columns is substantially greater than the distance between adjacent columns and rows of connection points.

23. The method of claim 22 wherein connection points in alternate columns are positioned between rows of connection points.

24. The method as set forth in claim 23 wherein said connection points are holes including conductive material formed in said substrate layer.

25. A method of increasing the density of holes formed in a fiber based integrated circuit carrier, comprising:
providing a fiber based integrated circuit carrier substrate having fibers extending in both the X and Y direction generally orthogonal to one another; and
forming holes of a given diameter in a pattern of generally orthogonal rows and columns that run parallel to the overall direction of said fibers with said rows and columns defining rows and columns of elongated strip regions of fibers of a width approximately equal to said diameter, said holes formed so that the holes in alternate rows are positioned between the said columns of elongated strip regions and the holes of alternate columns are positioned between the said columns of elongated strip regions.

26. The method as set forth in claim 25 wherein said alternate holes in said columns and rows are positioned to be substantially equidistant said elongated strip regions.

27. The method as set forth in claim 25 wherein said fiber based integrated circuit carrier substrate comprises multiple layers of fiber based material and said holes in said layers interconnect with connection points having a different pattern than said pattern.

28. The method as set forth in claim 27 wherein said holes include conductive material and act to connect at least one chip to a printed wiring board.

29. A method of positioning connection points on an integrated circuit carrier, comprising:
providing at least one layer of a fiber based material having an array of generally parallel fibers extending in generally orthogonal directions;
positioning an array of connection points along said at least one layer of fiber based material with said array of connection points comprising parallel rows and columns of equally spaced connection points extending in both the X and Y direction orthogonal to one another and arranged so that the said rows and columns of connection points are at an angle with respect to the said directions of said fibers.

30. The method set forth in claim 29 wherein said connection points are holes for conductive material.

* * * * *